(12) United States Patent
Mäki (10) Patent No.: US 10,509,076 B2
(45) Date of Patent: Dec. 17, 2019

(54) BATTERY PERFORMANCE MONITORING (71) Applicant: Microsoft Technology Licensing, LLC, Redmond, WA (US)

(72) Inventor: Jani Mäki, Turku (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 50 days.

(21) Appl. No.: 15/269,921

(22) Filed: Sep. 19, 2016

(65) Prior Publication Data
US 2018/0083455 A1 Mar. 22, 2018

(51) Int. Cl.
*G01R 31/36* (2019.01)
*G01R 31/382* (2019.01)
*G01R 31/389* (2019.01)
H02J 7/00 (2006.01)
H01M 2/34 (2006.01)

(52) U.S. Cl.
CPC ..... *G01R 31/3648* (2013.01); *G01R 31/3647* (2019.01); *G01R 31/382* (2019.01); *G01R 31/389* (2019.01); *H01M 2/348* (2013.01); *H02J 7/0029* (2013.01)

(58) Field of Classification Search
CPC ...... H02J 7/0026; H02J 7/0029; H02J 7/0031; H01M 10/443; H01M 2/34; H01M 2/348; B25F 5/00; G01R 31/3648; G01R 31/3606
See application file for complete search history.

(56) References Cited

U.S. PATENT DOCUMENTS

| 5,621,302 | A | 4/1997 | Shinohara | |
| 5,680,027 | A * | 10/1997 | Hiratsuka | G01R 31/3624 307/150 |
| 5,760,568 | A * | 6/1998 | Naskali | H01M 10/44 320/128 |
| 5,773,978 | A | 6/1998 | Becker | |
| 6,242,886 | B1 * | 6/2001 | Palanisamy | H02J 7/0075 320/100 |
| 6,788,069 | B2 * | 9/2004 | Vacher | B60L 11/1851 320/162 |
| 7,068,184 | B2 | 6/2006 | Yee et al. | |
| 7,091,698 | B2 * | 8/2006 | Yamazaki | G01R 31/3648 320/132 |

(Continued)

FOREIGN PATENT DOCUMENTS

JP 2009114939 A * 5/2009 ......... G01R 31/3624

OTHER PUBLICATIONS

"Charging Batteries from USB", Published on: Sep. 3, 2005, 9 pages, Available at: https://www.maximintegrated.com/en/app-notes/index.mvp/id/3607.

(Continued)

*Primary Examiner* — Helen Rossoshek (57) ABSTRACT

In an embodiment, a device comprises a controller configured to create a load pulse for a battery, measure battery voltage concurrently with the load pulse, measure battery current concurrently with the load pulse, calculate a battery resistance from the measured battery voltage and current and based on the battery resistance, calculate a maximum allowable current extractable from the battery, wherein the maximum allowable current is determined such that a voltage across the battery does not drop below a pre-specified threshold voltage when the maximum allowable current is drawn from the battery.

20 Claims, 4 Drawing Sheets

(56) References Cited

U.S. PATENT DOCUMENTS

| | | | |
|---|---|---|---|
| 7,508,171 B2* | 3/2009 | Carrier | B25F 5/00 320/135 |
| 7,554,296 B2* | 6/2009 | Mizuno | G01R 31/3624 320/106 |
| 7,671,566 B2* | 3/2010 | Du | G01R 31/3648 320/132 |
| 7,782,018 B2* | 8/2010 | Voigt | G03B 15/05 320/135 |
| 7,856,328 B2 | 12/2010 | Barsoukov et al. | |
| 7,859,226 B2* | 12/2010 | Nakazawa | H01M 2/34 320/134 |
| 8,129,996 B2* | 3/2012 | Iwane | G01R 31/3624 324/427 |
| 8,138,724 B2* | 3/2012 | Li | H02J 7/045 320/139 |
| 8,217,659 B2* | 7/2012 | Li | H01M 10/488 320/136 |
| 8,525,479 B2* | 9/2013 | Meyer | H02J 7/0004 320/125 |
| 8,536,872 B2* | 9/2013 | Ueda | G01R 31/3624 320/132 |
| 8,598,849 B2 | 12/2013 | Bhardwaj et al. | |
| 8,624,560 B2 | 1/2014 | Ungar et al. | |
| 8,756,025 B2 | 6/2014 | Banerjee et al. | |
| 8,823,325 B2* | 9/2014 | Ling | G01R 31/3651 320/132 |
| 8,827,484 B2* | 9/2014 | Messinger | F21L 4/005 320/107 |
| 8,975,874 B2* | 3/2015 | Berkowitz | H02J 7/0052 320/141 |
| 9,018,913 B2 | 4/2015 | Middleton et al. | |
| 2002/0075003 A1* | 6/2002 | Fridman | H02J 7/0047 324/426 |
| 2005/0155839 A1 | 7/2005 | Banks et al. | |
| 2008/0315834 A1* | 12/2008 | Cruise | H02J 7/0006 320/113 |
| 2010/0174499 A1 | 7/2010 | Kang et al. | |
| 2011/0031932 A1* | 2/2011 | Platonov | H01M 10/44 320/134 |
| 2011/0077879 A1 | 3/2011 | Paryani | |
| 2011/0112782 A1* | 5/2011 | Majima | G01R 31/361 702/63 |
| 2011/0199055 A1* | 8/2011 | Burchardt | H01M 10/44 320/148 |
| 2011/0244929 A1* | 10/2011 | Manor | H04B 1/04 455/572 |
| 2012/0004875 A1* | 1/2012 | Maeda | H01M 10/48 702/63 |
| 2012/0212184 A1 | 8/2012 | Klein et al. | |
| 2014/0266068 A1* | 9/2014 | O'Brien | H02J 7/0093 320/139 |
| 2014/0266228 A1 | 9/2014 | Baruzzi et al. | |
| 2015/0025822 A1* | 1/2015 | Ladret | G01R 31/3662 702/63 |
| 2015/0229155 A1 | 8/2015 | Sporck et al. | |
| 2015/0303712 A1* | 10/2015 | Cabelka | A61N 1/3981 607/6 |
| 2016/0204624 A1* | 7/2016 | Small, Jr. | H02J 7/0021 320/139 |
| 2016/0232736 A1* | 8/2016 | Holtappels | H01M 10/4257 |
| 2016/0233693 A1* | 8/2016 | Suzuki | B60L 11/1861 |
| 2016/0274193 A1* | 9/2016 | Imaizumi | G01R 31/3651 |

OTHER PUBLICATIONS

"Battery Station", Published on: Oct. 27, 2015, 21 pages, Available at: http://www.tactec.jp/download/array/Battery_station_s151028-A3-E.pdf.

Moore, et al., "Control and Management Strategies for the Delphi High Power Lithium Battery", In Proceedings of 18th International Battery, Hybrid and Fuel Cell Electric Vehicle Symposium & Exhibition, Oct. 2001, 11 pages.

"Bq27530-G1 Battery Management Unit Impedance Track™ Fuel Gauge with MaxLife™ Technology for Use with the bq2416x Charger Controller", Published on: Dec. 2012, 33 pages, Available at: http://www.ti.com/lit/ds/symlink/bq27530-g1.pdf.

Richardson, et al., "Sensorless Battery Internal Temperature Estimation using a Kalman Filter with Impedance Measurement", In Journal of the Computing Research Repository, Jan. 2015, pp. 1-10.

* cited by examiner

BATTERY PERFORMANCE MONITORING

BACKGROUND

Portable devices comprise a battery as an energy source. A battery may comprise a single cell or multiple cells in series and/or parallel. Voltage available at the terminals of the battery fluctuates during a charge-discharge cycle. The battery of a device powers multiple components of the device with variable current needs. Battery characteristics (for example the battery internal resistance or the equivalent series resistance) and battery operation are affected by environmental and temporal factors, such as temperature and age of the battery, causing the operation of the portable device to be affected.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

A battery performance monitoring device is described. In an embodiment, a device comprises a controller configured to create a load pulse for a battery, measure battery voltage concurrently with the load pulse, measure battery current concurrently with the load pulse, calculate a battery resistance from the measured battery voltage and current and based on the battery resistance, calculate a maximum allowable current extractable from the battery, wherein the maximum allowable current is determined such that a voltage across the battery does not drop below a pre-specified threshold voltage when the maximum allowable current is drawn from the battery.

In other embodiments, an apparatus and a method are discussed.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

DETAILED DESCRIPTION

The detailed description provided below in connection with the appended drawings is intended as a description of the embodiments and is not intended to represent the only forms in which the embodiment may be constructed or utilized. However, the same or equivalent functions and structures may be accomplished by different embodiments.

Although the embodiments may be described and illustrated herein as being implemented in a smartphone, this is only an example implementation and not a limitation. As those skilled in the art will appreciate, the present embodiments are suitable for application in a variety of different types of devices comprising a battery as a power source, for example laptop computers, tablet computers, phablets, mobile phones, navigation tools, wearable devices, portable game consoles, portable media players, calculators, digital cameras, power tools and electric vehicles, etc.

Rechargeable batteries power a number of portable devices and apparatuses, from smartphones to power tools to hybrid or electric vehicles. The operation and user experience of such devices and apparatuses may be affected by the operation of the batteries powering them. A device may need a certain minimum voltage from its power source to stay operational, below which voltage its components may fail to work. This voltage may be called the system shutdown voltage.

Battery voltage may depend upon multiple factors, including state of charge of the battery, current being drawn from the battery, ambient temperature, battery chemistry, internal resistance of the battery etc. State of charge of a battery may depend upon chemistry of the battery and actual energy stored in the battery and may be algorithmically calculated based on an average idealized battery. Further temperature of the battery may depend upon thermal mass of the battery. Sensors used to measure the battery temperature may be inaccurate because of placement of the sensor being constrained by form factor of the device and/or battery. Internal resistance of a battery may strongly correlate with the temperature. Given the inaccuracy in estimation of state of charge and temperature, it may be difficult to calculate the internal resistance and battery voltage.

In particular, it may difficult to predict the battery voltage if an application was to draw current from the battery, specifically in non-room temperature conditions. In such conditions load currents above a threshold, when drawn from the battery, may result in the battery voltage dropping below safe voltage and/or a system shutdown voltage. According to an embodiment, instantaneous impedance of a battery may be calculated by creating a load pulse for the battery and concurrently measuring the current drawn from and voltage at the battery terminals. From this impedance the voltage drop across the battery at a load current level may be estimated in real-time or substantially real-time. According to an embodiment, if a load current is estimated to cause the battery voltage to drop below a threshold level, which may be a system shutdown level or higher, the load may be allowed to draw a smaller current, keeping the device working which can improve the user experience. A graceful shutdown may be initiated at a safe voltage which is higher than the system shutdown voltage, for example by a safety margin. Graceful shutdown may include saving unsaved user data and state of services run by the device and terminating the services. This may provide an improved user experience wherein the user does not lose unfinished work.

Furthermore, if the instantaneous voltage of the battery is found to be too low (i.e., below the threshold level) a graceful shutdown may be initiated, saving user data and/or state of the device. According to an embodiment, a battery may be protected by preventing large load currents when ambient temperature is not optimal for battery operation, for example, below 5° C. According to an embodiment, accurate measurement of internal impedance and hence the maximum allowable current may be carried out for a battery irrespective of its age, model used for state of charge and manufacturer. The device functionality may be improved by preventing system shutdown, for example at low temperatures.

Figure 1:
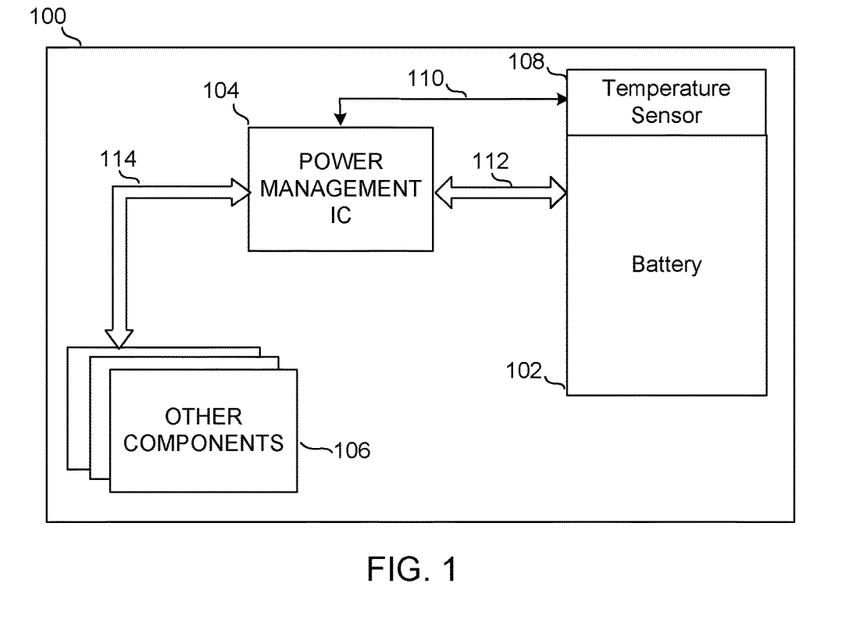
FIG. 1 illustrates a schematic representation of a device comprising a battery and a controller for managing operation of the battery according to an embodiment.

FIG. 1 illustrates, as a block diagram, a device 100 according to an embodiment. The device 100 comprises a battery 102, controller 104, and multiple other components 106 powered by the battery 102, a temperature sensor 108 and busses 110, 112 and 114 for transmission of power and/or control data. The bus 112 may be configured between the battery 102 and controller 104. The bus 110 may be configured between the temperature sensor 108 and the controller 104. Bus 114 may be configured between the controller 104 and other components 106. Controller 104 may be configured to control the current flowing into and out of battery 102 and also the supply of current to other components 106. Temperature sensor 108 may be configured to measure a temperature of the battery 102 and send the measured temperature controller 104 via bus 110 either on receiving instructions from the controller 104 or if the temperature of the battery 102 changes.

Referring to FIG. 1 the controller 104 may be configured to create periodic load pulses for loading the battery 102. The period of the pulse may be regular or irregular, depending on multiple factors, for example including ambient temperature or temperature of the battery. A load pulse may be created by, for example connecting a unit or known electric load to terminals of battery 102 for a pre-specified period of time. During a load pulse, the controller 104 may measure the current drawn $I_d$ from battery 102 and the voltage $V_{bat}$ across the battery 102 terminals. An instantaneous internal resistance $Z_{inst}$ of the battery 102 may be calculated from the current $I_d$ and voltage $V_{bat}$ so measured, using Ohm's law. Further a maximum allowable current $I_{max}$ which can be drawn from the battery based on the determined internal resistance $Z_{inst}$ may be determined. $I_{max}$ may be calculated from a threshold minimum battery voltage $V_{min}$ and the calculated battery internal resistance $Z_{inst}$ using the equation: Imax=(Vbat−Vmin)/Zinst. The controller 104 may further estimate a load current $I_{est}$, for example needed by one or more of the other components 106. This estimated load current $I_{est}$ is compared with the maximum allowable current $I_{max}$ and if $I_{est}$ is less than $I_{max}$, the load is allowed to draw a load current and if $I_{est}$ greater than $I_{max}$, the load is not allowed to draw a load current or is allowed to a draw only a reduced current. In both cases the current drawn is such that the voltage across the battery does not drop below $V_{min}$.

According to an embodiment, the battery voltage may be prevented from falling below minimum threshold level $V_{min}$, which may be either the system shutdown voltage $V_{sd}$ or a sum of the system shutdown voltage $V_{sd}$ and a safety margin. In some embodiments, the period of load pulses may be adjusted based on temperature of the battery 102 as measured by temperature sensor 108 and communicated to controller 104 over bus 110. In some embodiments, reception of a temperature below a threshold or above a threshold may trigger the controller 104 to create a load pulse and re-calculate maximum allowable current $I_{max}$. According to an embodiment, the controller 104 may store the value of maximum allowable current $I_{max}$ so obtained until the next calculation. The controller 104 may broadcast the maximum allowable current $I_{max}$ to the other components 106, or a component 106 may request the maximum allowable current $I_{max}$. In one embodiment, one or more of the other components 106 may estimate their own load current $I_{est}$, compare $I_{est}$ with $I_{max}$ and if $I_{est}$ is greater than $I_{max}$, adjust their functionality to decrease the load current below $I_{max}$. For example, one other component 106 may comprise a light source, which may be operated at a lower light intensity to reduce load current below $I_{max}$, or may be completely turned off to prevent load current from exceeding $I_{max}$.

Referring again to FIG. 1, the controller 104 may comprise a power management integrated circuit (PMIC), comprising a processor and memory containing instructions. In some embodiments controller 104 may comprise an application specific integrated circuit with the necessary hard-wired logic.

Figure 2:
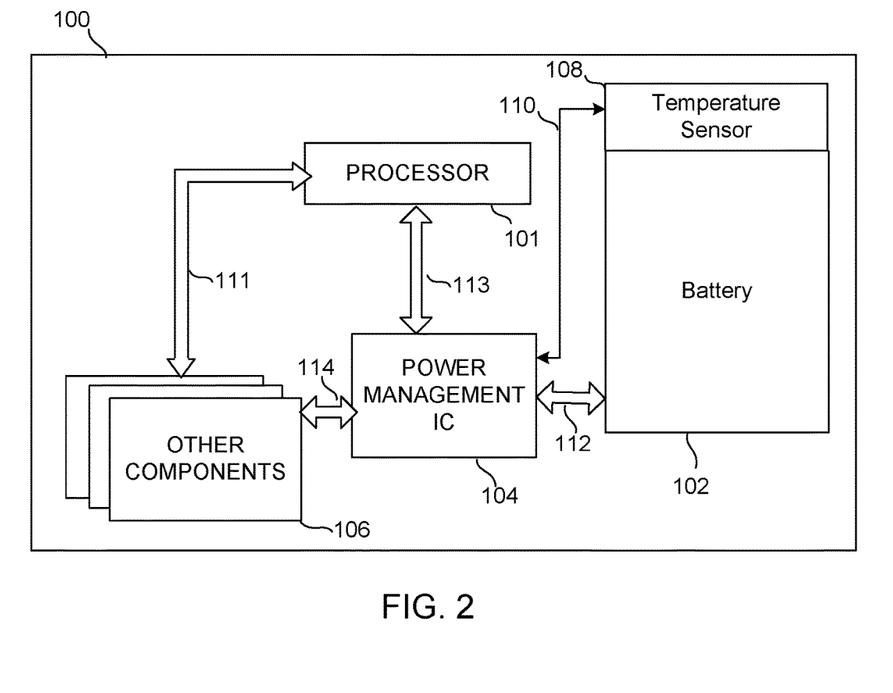
FIG. 2 illustrates a schematic representation of a device comprising a battery and a processor for managing operation of the battery according to an embodiment.

FIG. 2 illustrates a device 100 according to an embodiment as a block diagram. The device comprises a battery 102, a processor 101, a power management integrated circuit 104, a temperature sensor 108, other components 106 and busses 110, 111, 112, 113 and 114 for communication and power delivery. Power management IC 104 may be configured to manage operation of battery 102, for example charging and protection. The device 100 further comprises a memory (not shown in FIG. 2) that includes instructions. The instructions may cause the processor 101 to carry out functionality as described in embodiments of FIG. 1, by controlling the power management IC 104. Further, the calculation of $I_{max}$ may be carried out by the processor 101 while the load pulse creation and measurement may be carried out by the power management IC 104 under the control of the processor 101.

Referring to FIG. 1 and FIG. 2, according to an embodiment, the calculated value of maximum allowable current $I_{max}$ may be stored in a memory or storage until the next load pulse and subsequent calculation. According to an embodiment, the controller 104 or processor 101 may communicate the $I_{max}$ so calculated to the other components 106 and the other components 106 may adjust their load current requests accordingly.

Figure 3:
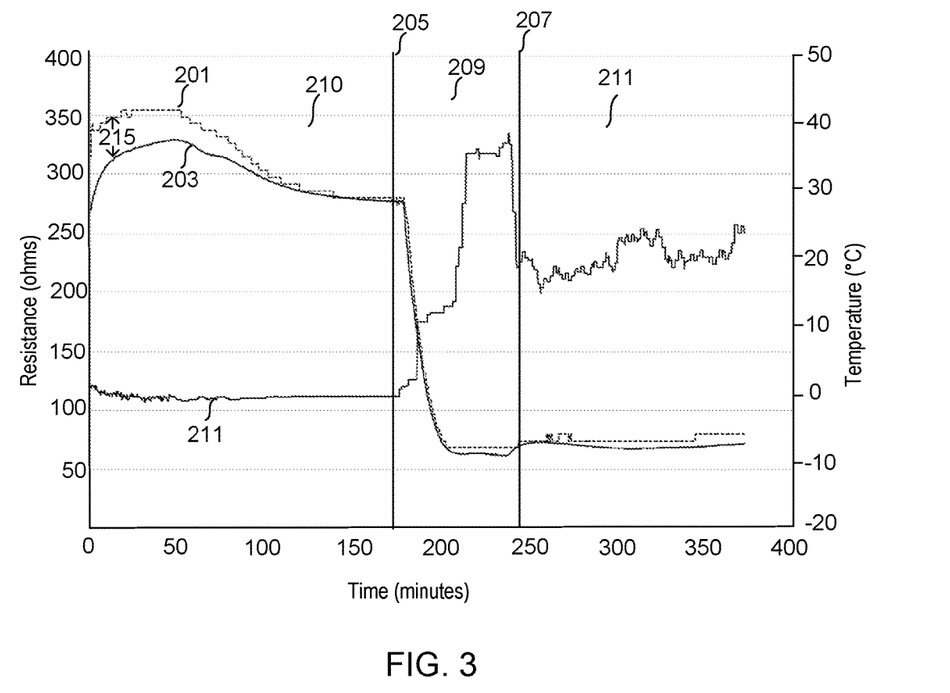
FIG. 3 illustrates a graphical representation of change in internal resistance with respect to change in ambient temperature of a Lithium Polymer battery.

FIG. 3 graphically illustrates the change in internal resistance 211 of a lithium polymer battery with respect to temperature 203 and charging and discharging. It also illustrates the battery temperature as measured by a temperature sensor 201 and actual battery temperature 203. The graph of FIG. 3 is divided into three regions 210, 209 and 211 between lines 205 and 207 drawn for illustration purposes. In region 210, the battery is charging at room temperature. As can be seen from FIG. 3, the internal resistance 211 of the battery in this region is substantially constant. An error 215 may also exist between the temperature as measured by sensor 201 and actual battery temperature 203. In region 209, the ambient temperature and hence battery temperature 203 drops from room temperature to −10 degree Celsius while the battery is under no load. As illustrated in FIG. 3, the internal resistance 211 rapidly rises during this period. Region 211 illustrates the battery resistance 211 when the battery is discharged at −10 degree Celsius. As can be seen there is a general increasing trend in internal impedance of the battery as temperature decreases. According to an embodiment, the characteristics illustrated in FIG. 3 may be applicable to battery 102 of FIG. 1 and FIG. 2.

Referring to FIG. 3, the increased internal impedance of battery at lower temperatures may cause larger voltage drops across the battery when load currents are drawn as compared to voltage drops at room temperature with similar load currents. This may cause, for example, the battery voltage to drop to unsafe or unwanted levels, damaging the battery or causing hardware shutdown, which may translate to non-optimal user experience.

Figure 4:
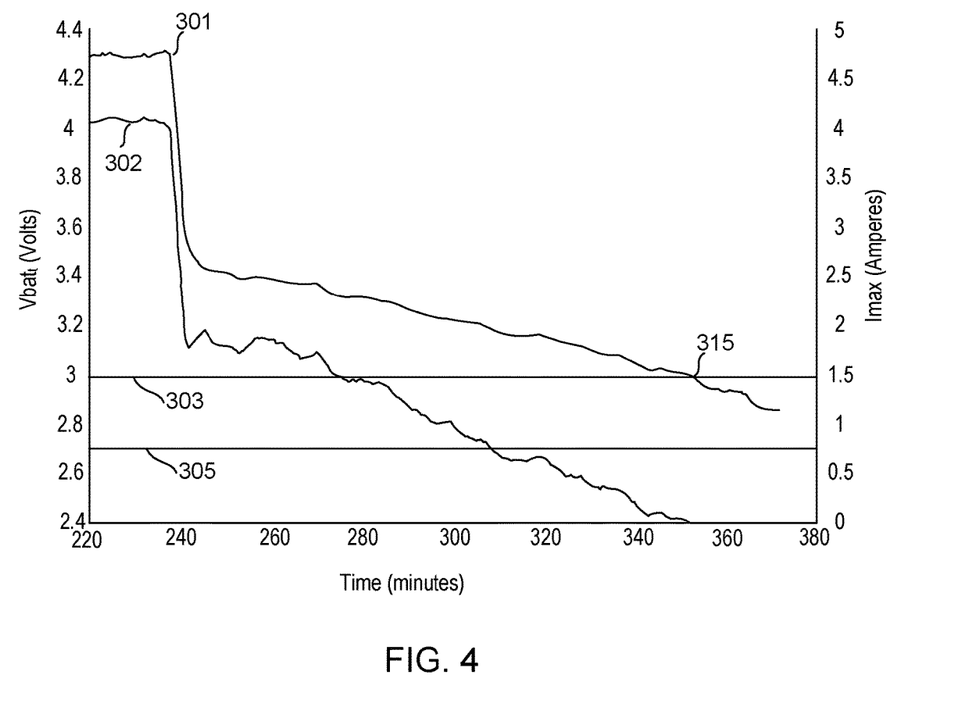
FIG. 4 illustrates a graphical representation of Lithium Polymer battery voltage and maximum current which is available from the battery, with respect to time.

FIG. 4 graphically illustrates maximum allowable current $I_{max}$ 302 at a given battery voltage $V_{bat}$ 301 of a lithium polymer battery over time. Line 303 illustrates a safe minimum battery voltage threshold $V_{min}$, above which a device, powered by the battery may operate safely. Line 305 illustrates a system shutdown voltage $V_{sd}$ at or below which the device powered by the battery shuts down. As illustrated in FIG. 3, with time, the battery voltage $V_{bat}$ 301 drops steadily and so does the maximum allowable current $I_{max}$ 302. The drop in $I_{max}$ is steeper due to uneven increase in internal resistance of the battery as it discharges. The maximum allowable $I_{max}$ is calculated on the basis of $V_{min}$ 303, such that if a load current $I_{max}$ is drawn, the voltage drop across internal resistance of the battery does not cause the battery voltage to fall below $V_{min}$. When the battery voltage $V_{bat}$ 301 is equal to $V_{min}$ at point 315, the maximum allowable current $I_{max}$ drops to zero, indicating no more load current can be supported by the battery. A graceful shutdown may be initiated at this point. A graceful shutdown may include saving user data and/or state of the device, consequently improving user experience. The gap between $V_{min}$ 303 and $V_{sd}$ 305 may be a safety margin, for example to prevent damage to the battery or to allow a graceful shutdown. According to an embodiment, the characteristics described herein may be applicable to device 100 and battery 102 of FIG. 1 and FIG. 2.

Figure 5:
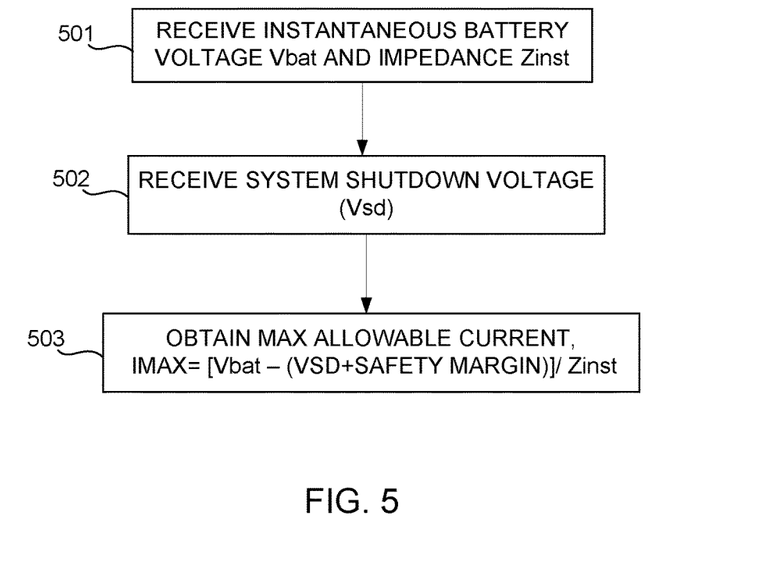
FIG. 5 illustrates a schematic flow chart of calculating a maximum allowable current of a battery in accordance with an embodiment.

FIG. 5 illustrates a flow chart of a method for calculating a maximum allowable current $I_{max}$ from a battery 102, according to an embodiment. The method may be implemented in a controller 104 or in a processor 101 in control of and in communication with a controller 104, wherein the controller operates the battery 102. The method may include operations 501, 502 and 503.

Referring to FIG. 5, operation 501 may include receiving instantaneous battery voltage $V_{bat}$ and instantaneous battery impedance $Z_{inst}$. $Z_{inst}$ may be calculated from instantaneous battery voltage $V_{bat}$ and instantaneous battery current measured during a load pulse. The instantaneous battery voltage may be received, for example from a means of measuring voltage or a storage, wherein the storage may include registers, any of the various types of memory, or hard disk drives.

Operation 502 may include receiving a system shutdown voltage $V_{sd}$. The system shutdown voltage may be received, for example, from a storage. The system shutdown voltage may be stored in the storage at the time of assembly or manufacture of the device 100.

Operation 503 may include adding a safety margin to the system shutdown voltage $V_{sd}$ and subtracting the sum so obtained from battery voltage $V_{bat}$ and then dividing the result by the instantaneous impedance $Z_{inst}$ to obtain maximum allowable current $I_{max}$. The safety margin may be added, for example to allow graceful shutdown of a device 100 powered by the battery 102. According to an embodiment, the safety margin may have a fixed value and may be stored in a storage. In another embodiment, the safety margin may be dynamically calculated, depending, for example, upon the state of operation of device 100 or user preference. According to an embodiment, no safety margin may be added.

Figure 6:
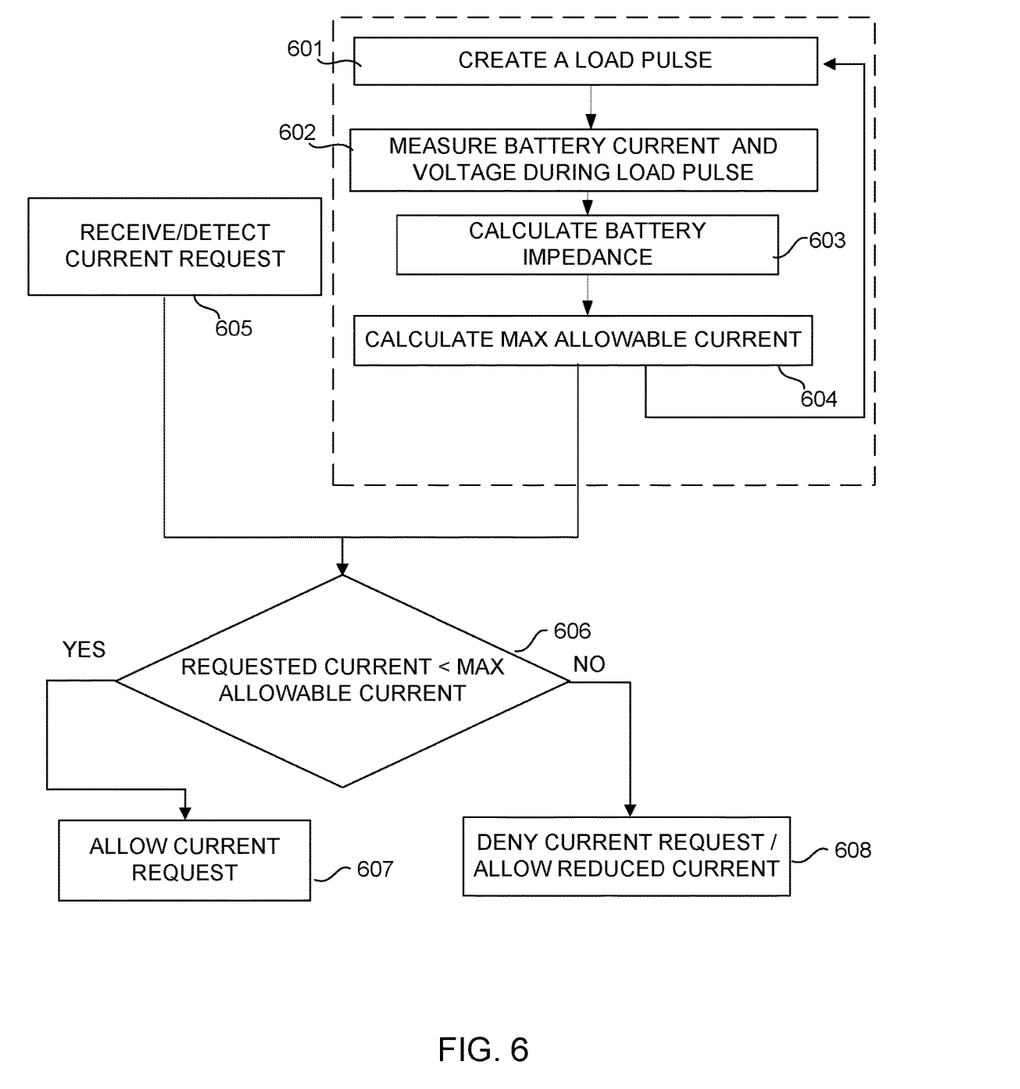
FIG. 6 illustrates a schematic flow chart of a method of managing current drawn from a battery; Like references are used to designate like parts in the accompanying drawings.

FIG. 6 illustrates, as a schematic flow chart, a method managing the operation of a battery 102 in accordance with an embodiment. Referring to FIG. 6, according to an embodiment the process comprises operations 601 through 608. According to an embodiment, the process of FIG. 6 may be compiled into the program code and executed by a processor 101 in conjunction with other components 106 of a device 100. According to another embodiment, the process of FIG. 6 may be carried out by a controller 104 wherein at least a part of the necessary logic is hard wired. According to yet another embodiment, the process of FIG. 6 may be carried out collaboratively in parts by a processor 106, a controller 104 and other components 106 of a device 100.

Operation 601 may include creating a load pulse for the battery. This load pulse and the subsequent calculations, for example operations 602 through 604, may be periodic or triggered by an event. The period may depend upon various factors including temperature of the battery 102. According to an embodiment, at lower temperatures, the period may be smaller and at higher temperatures, the period may be higher. According to an embodiment, the period of the load pulse and subsequent calculations may be chosen from 10 seconds, 30 seconds, 60 seconds, 90 seconds, 120 seconds, 300 seconds or any value in between. Further the event to trigger the load pulse may be, for example, decreased in battery temperatures below a threshold.

Operation 602 may include measuring the current drawn from the battery 102 and the voltage across the battery terminals during the load pulse. Operation 602 may be carried out concurrently with operation 601.

Operation 603 may include calculating the instantaneous battery impedance from the battery voltage and current measured in operation 602.

Operation 604 may include calculating the maximum allowable current that can be drawn from the battery in the form of a value which may be a numeric value. Operation 604 may include the process described in embodiments of FIG. 5. The value of maximum allowable current, in the form of a value calculated in operation 604 may be stored, for example, until the calculation is done again.

Operation 605 may include detecting or receiving a load current request. Whether a component is trying to draw a load current may be actively detected and the load current estimated, or a component 106 may send a request for a load current. According to an embodiment, operation 605 may be carried out by one of the other components 106 and may include estimating load current needed for an operation, wherein the operation is carried out by the same component 106.

Operation 606 may include comparing the requested or estimated load current of operation 605 to the maximum allowable current calculated in operation 604. If the requested or estimated current is less than the maximum allowable current, operation 607 may be carried out. If the requested or estimated load current of operation 605 is greater or equal to the maximum allowable current of operation 604, operation 608 may be carried out. In embodiments where operation 605 is carried out in one of the components 106, operation 606 may be carried out in the same component and may include receiving the maximum allowable current and comparing the estimated load current with the maximum allowable current.

Operation 607 may include allowing the load to draw the requested or estimated load current. In embodiments where the operation 606 is carried out in one of the other components 106, operation 607 may be carried out in the same component and may include drawing the estimated load current.

Operation 608 may include preventing the load from drawing the requested or estimated load current. Operation 608 may further include allowing the load to draw a reduced load current which is less than the maximum allowable current. In embodiments where the operation 606 is carried out in one of the other components 106, operation 608 may be carried out in the same component and may include either terminating the operation for which load current was estimated or altering it such that the load current needed is lesser than the maximum allowable current. Operation 608 may further include drawing the load current for the altered operation. For example, one of the other components 106 may be a camera flash module. In case the flash module estimates a load current for a flashing operation which is higher than the maximum allowable current, the camera flash can either be disabled completely or the flash power can be dynamically reduced such that the load current is lesser than the maximum allowable current.

The methods and functionalities described herein may be performed by software in machine readable form on a tangible storage medium e.g. in the form of a computer program comprising computer program code means adapted to perform all the functions and the steps of any of the methods described herein when the program is run on a computer and where the computer program may be embodied on a computer readable medium. Examples of tangible storage media include computer storage devices comprising computer storage media such as disks, thumb drives, memory etc. The software can be suitable for execution on a parallel processor or a serial processor such that the method steps may be carried out in any suitable order, or simultaneously.

This acknowledges that software can be a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Those skilled in the art will realize that storage devices utilized to store program instructions can be distributed across a network. For example, a remote computer may store, parts or all of, an example of the process described as software. A local or terminal computer may access the remote computer and download a part or all of the software to run the program. Alternatively, the local computer may download pieces of the software as needed, or execute some software instructions at the local terminal and some at the remote computer (or computer network). Alternatively, or in addition, the functionally described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

According to an embodiment, a device comprising: a controller configured to: create a periodic load pulse for a battery; measure a battery voltage concurrently with the load pulse; measure a battery current concurrently with the load pulse; calculate a battery resistance from the measured battery voltage and the measured battery current; and based on the battery resistance, calculate a maximum allowable current extractable from the battery, wherein the maximum allowable current is determined such that a voltage across the battery does not drop below a pre-specified threshold voltage if the maximum allowable current is drawn from the battery. Alternatively or in addition to the above, the controller is further configured to: estimate a load current needed by a load; compare the estimated load current to the maximum allowable current; allow the load to draw the estimated current if the estimated load current is less than the maximum allowable current; and allow the load to draw a current which is lesser than the maximum allowable load current if the estimated load current is greater than the maximum allowable load current. Alternatively or in addition to the above, the load comprises at least one of a hardware component, a software application, or a combination thereof. Alternatively or in addition to the above, further comprising a component, wherein the component is configured to: receive the maximum allowable current from the controller; estimate a load current needed for an operation; compare the estimated load current with the maximum allowable current; draw current if the estimated load current is less than the maximum allowable current; and alter operation of the component if the estimated current is greater than the maximum allowable current, wherein altering the operation comprises one of: terminating the operation, or adapting the operation to draw less current. Alternatively or in addition to the above, the pre-specified threshold voltage is equal to a sum of a system shutdown voltage and a safety margin voltage. Alternatively or in addition to the above, further comprising a temperature sensor configured to measure a temperature of the battery. Alternatively or in addition to the above, the controller is configured to receive a temperature of the battery and adjust a period of creation of the periodic load pulse. Alternatively or in addition to the above, the controller is configured to receive the temperature of the battery, compare the temperature to a threshold temperature and if the temperature is below the threshold temperature, re-determine the maximum allowable current.

According to an embodiment, an apparatus comprising: a battery; an electric load; and a controller configured to: estimate a load current needed by the electric load; create a load pulse for the battery; measure a battery voltage concurrently with the load pulse; measure a battery current concurrently with the load pulse; calculate a battery resistance from the measured battery voltage and the measured battery current; based on the battery resistance, calculate a maximum allowable current extractable from the battery, wherein the maximum allowable current is determined so that a voltage across the battery does not drop below a pre-specified threshold voltage if the maximum allowable current is drawn from the battery; compare the estimated load current with the maximum allowable current; allow the electric load to draw the estimated load current if the estimated load current is less than the maximum allowable current; and prevent the electric load from drawing the estimated load current if the estimated load current is less than the maximum allowable current.

Alternatively or in addition to the above, further comprising a temperature sensor configured to measure a temperature of the battery. Alternatively or in addition to the above, the controller is further configured to: receive the temperature of the battery; compare the temperature with a threshold temperature; and recalculate the maximum allowable current if the temperature is below the threshold temperature. Alternatively or in addition to the above, the controller is further configured to: calculate the maximum allowable current periodically, the period being based on the temperature received from the temperature sensor. Alternatively or in addition to the above, the estimation of the load current is based at least partly on previously drawn currents by the electric load. Alternatively or in addition to the above, the pre-specified threshold voltage is a sum of a system shutdown voltage and a safety margin voltage. Alternatively or in addition to the above, if the maximum allowable current is below a pre-specified threshold, a graceful shutdown of the apparatus is initiated.

According to an embodiment, a method, executed by a controller, comprising: creating a load pulse for a battery; measuring a battery voltage concurrently with the load pulse; measuring a battery current concurrently with the load pulse; calculating a battery resistance from the measured battery voltage and battery current; based on the battery resistance, calculating a maximum allowable current extractable from the battery, wherein the maximum allowable current is determined such that a voltage across the battery does not drop below a pre-specified threshold voltage when the maximum allowable current is drawn from the battery; and storing a value of the maximum allowable current in a memory.

Alternatively or in addition to the above, further comprising: estimating a load current needed by a load; comparing the estimated load current to the maximum allowable current; allowing the load to draw the estimated load current if the estimated load current is less than the maximum allowable current; and allowing the load to draw a current that is lesser than the maximum allowable load current if the estimated load current is greater than the maximum allowable load current. Alternatively or in addition to the above, further comprising: receiving a temperature of the battery, from a temperature sensor configured to measure the temperature of the battery; comparing the received temperature with a threshold temperature; and if the received temperature is less than the threshold temperature, re-determining the maximum allowable current. Alternatively or in addition to the above, the pre-specified threshold voltage is equal to a system shutdown voltage. Alternatively or in addition to the above, the pre-specified threshold voltage is equal to a sum of a system shutdown voltage and a safety margin voltage.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

The embodiments illustrated and described herein as well as embodiments not specifically described herein but within the scope of aspects of the disclosure constitute exemplary means for measuring current, exemplary means for measuring voltage, exemplary means creating a load pulse, exemplary means for calculating, exemplary means for storing values of electrical quantities including current, voltage and impedance, exemplary means for comparing values of electrical quantities, exemplary means for estimating load currents, exemplary means of regulating load current. For example, the elements illustrated in FIG. 1 and FIG. 2 constitute exemplary means for measuring current, exemplary means for measuring voltage, exemplary means creating a load pulse, exemplary means for calculating, exemplary means for storing values of electrical quantities including current, voltage and impedance, exemplary means for comparing values of electrical quantities, exemplary means for estimating load currents, exemplary means of regulating load current.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A device comprising:
 a controller configured to:
  create a periodic load pulse for a battery;
  receive a temperature of the battery;
  measure a battery voltage during creation of the load pulse;
  measure a battery current during creation of the load pulse;
  calculate a battery resistance from the measured battery voltage and the measured battery current; and
  based on the battery resistance and the temperature of the battery, calculate a maximum allowable current extractable from the battery, wherein the maximum allowable current is determined such that a voltage across the battery does not drop below a system shutdown threshold voltage if the maximum allowable current is drawn from the battery and does drop below the system shutdown threshold voltage when a current greater than the maximum allowable current is drawn from the battery.

2. The device of claim 1, wherein the controller is further configured to:
 estimate a load current needed by a load;
 compare the estimated load current to the maximum allowable current;
 allow the load to draw the estimated current if the estimated load current is less than the maximum allowable current; and allow the load to draw a current which is lesser than the maximum allowable load current if the estimated load current is greater than the maximum allowable load current.

3. The device of claim 2, wherein the load comprises at least one of a hardware component, a software application, or a combination thereof.

4. The device of claim 1, further comprising a component, wherein the component is configured to:
receive the maximum allowable current from the controller;
estimate a load current needed for an operation;
compare the estimated load current with the maximum allowable current;
draw current if the estimated load current is less than the maximum allowable current; and
alter operation of the component if the estimated current is greater than the maximum allowable current, wherein altering the operation comprises one of: terminating the operation, or adapting the operation to draw less current.

5. The device of claim 1, wherein the system shutdown threshold voltage is equal to a sum of a system shutdown voltage and a safety margin voltage.

6. The device of claim 1, further comprising a temperature sensor configured to measure the temperature of the battery.

7. The device of claim 6, wherein the controller is configured to receive a temperature of the battery from the temperature sensor.

8. The device of claim 6, wherein the controller is configured to compare the temperature to a threshold temperature and if the temperature is below the threshold temperature, re-determine the maximum allowable current.

9. A computer-readable storage device comprising computer-executable instructions that, when executed by one or more processors, cause the one or more processors to perform the following operations:
estimate a load current needed by the electric load;
create a load pulse for the battery;
receive a temperature of the battery;
measure a battery voltage during creation of the load pulse;
measure a battery current during creation of the load pulse;
calculate a battery resistance from the measured battery voltage and the measured battery current;
based on the battery resistance and the temperature of the battery, calculate a maximum allowable current extractable from the battery, wherein the maximum allowable current is determined so that a voltage across the battery does not drop below a system shutdown threshold voltage if the maximum allowable current is drawn from the battery and does drop below the system shutdown threshold voltage when a current greater than the maximum allowable current is drawn from the battery;
compare the estimated load current with the maximum allowable current;
allow the electric load to draw the estimated load current if the estimated load current is less than the maximum allowable current; and
prevent the electric load from drawing the estimated load current if the estimated load current is greater than the maximum allowable current.

10. The computer-readable storage device of claim 9, receiving, from a temperature sensor, the temperature of the battery.

11. The computer-readable storage device of claim 10, wherein the computer-executable instructions further cause the one or more processors to perform the following operations:
compare the temperature with a threshold temperature; and
recalculate the maximum allowable current if the temperature is below the threshold temperature.

12. The computer-readable storage device of claim 10, wherein the computer-executable instructions further cause the one or more processors to perform the following operation: calculate the maximum allowable current periodically, the period being based on the temperature received from the temperature sensor.

13. The computer-readable storage device of claim 9, wherein the estimation of the load current is based at least partly on previously drawn currents by the electric load.

14. The computer-readable storage device of claim 9, wherein the pre-specified threshold voltage is a sum of a system shutdown voltage and a safety margin voltage.

15. The computer-readable storage device of claim 9, wherein if the maximum allowable current is below a pre-specified threshold, a graceful shutdown of the apparatus is initiated.

16. A method, executed by a controller, comprising:
creating a load pulse for a battery;
receive a temperature of the battery;
measuring a battery voltage during creation of the load pulse;
measuring a battery current during creation of the load pulse;
calculating a battery resistance from the measured battery voltage and battery current;
based on the battery resistance and the temperature of the battery, calculating a maximum allowable current extractable from the battery, wherein the maximum allowable current is determined such that a voltage across the battery does not drop below a system shutdown threshold voltage when the maximum allowable current is drawn from the battery and does drop below the system shutdown threshold voltage when a current greater than the maximum allowable current is drawn from the battery; and
storing a value of the maximum allowable current in a memory.

17. The method of claim 16, further comprising:
estimating a load current needed by a load;
comparing the estimated load current to the maximum allowable current;
allowing the load to draw the estimated load current if the estimated load current is less than the maximum allowable current; and
allowing the load to draw a current that is lesser than the maximum allowable load current if the estimated load current is greater than the maximum allowable load current.

18. The method of claim 16 further comprising:
receiving the temperature of the battery, from a temperature sensor configured to measure the temperature of the battery;
comparing the received temperature with a threshold temperature; and
if the received temperature is less than the threshold temperature, re-determining the maximum allowable current.

19. The method of claim 16, wherein the pre-specified threshold voltage is equal to a system shutdown voltage.

20. The method of claim 16, wherein the pre-specified threshold voltage is equal to a sum of a system shutdown voltage and a safety margin voltage.

\* \* \* \* \*